United States Patent

Ito et al.

[11] 4,122,213
[45] Oct. 24, 1978

[54] METHOD FOR METALLIZING A PHOSPHOR SCREEN FOR A CATHODE RAY TUBE

[75] Inventors: Takeo Ito, Kumagaya; Hatsuo Tsukagoshi, Fukaya, both of Japan

[73] Assignee: Tokyo Shibaura Electric Company, Limited, Tokyo, Japan

[21] Appl. No.: 661,720

[22] Filed: Feb. 26, 1976

[30] Foreign Application Priority Data

Mar. 3, 1975 [JP] Japan .................................. 50/25816
Mar. 31, 1975 [JP] Japan .................................. 50/37826

[51] Int. Cl.$^2$ ............................................. B05D 5/12
[52] U.S. Cl. ...................................... 427/64; 427/68; 427/69; 427/124; 427/226; 427/380; 427/383 R; 427/383 A; 427/385 R; 427/385 A
[58] Field of Search .................... 427/64, 68, 226, 227, 427/124, 380, 385 A, 385 R, 387, 407 R, 407 A, 419 R, 419 D, 108, 383, 69

[56] References Cited

U.S. PATENT DOCUMENTS

| | | | |
|---|---|---|---|
| 3,067,055 | 12/1962 | Saulnier, Jr. | 427/68 |
| 3,317,337 | 5/1967 | Saulnier | 427/68 |
| 3,574,663 | 4/1971 | Schniepp | 427/68 |
| 3,579,367 | 5/1971 | Patel | 427/68 |
| 3,582,389 | 6/1971 | Saulnier | 427/68 |
| 3,582,390 | 6/1971 | Saulnier | 427/68 |
| 3,821,009 | 6/1974 | Lerner et al. | 427/64 |
| 3,839,068 | 10/1974 | Miura | 427/68 |

*Primary Examiner*—Cameron K. Weiffenbach
*Attorney, Agent, or Firm*—Oblon, Fisher, Spivak, McClelland & Maier

[57] ABSTRACT

A method for metallizing a phosphor screen for a cathode ray tube including the steps of forming a volatilizable substrate on the surface of the phosphor screen and depositing a metal layer on the substrate, followed by heating for volatilizing the substrate, said substrate comprising a laminate of superposed layers respectively representing different organic materials having different thermal decomposition points. This disclosed method is advantageous in that the substrate can be volatilized without causing blistering of the metal layer and the formed metal layer is enabled to reflect light more effectively.

6 Claims, 2 Drawing Figures

METHOD FOR METALLIZING A PHOSPHOR SCREEN FOR A CATHODE RAY TUBE

BACKGROUND OF THE INVENTION

This invention relates to a method of metallizing the surface of a phosphor screen for a cathode ray tube like a color television picture tube, more particularly, to the improvements in volatilizable substrates for the metal.

Phosphor screen for a cathode ray tube, for example, a tricolor mosaic screen for a color television picture tube, comprises phosphor dots or stripes arranged in a predetermind pattern on the surface of a glass face plate. The phosphor dots consist of dots of a blue-emitting phosphor, dots of a green-emitting phosphor and dots of a red-emitting phosphor. Formed on the surface of the phosphor screen is a so-called metal back, i.e., an electron-permeable metal layer like an aluminum layer. The metal layer acts as a light reflector and an electrical conductor. Since the surface of the phosphor screen is rough, the metal layer fails to have a specular smooth surface if formed directly on the surface of the phosphor screen, resulting in a decreased amount of luminescent light reflected by the metal layer toward the viewer. It follows that the light output of the cathode ray tube becomes insufficient, namely, the tube lacks in satisfactory brightness.

To solve the problem, attempts have been made to improve the method of metallizing the phosphor screen. A typical prior art in this line includes the steps of producing upon the surface of the phosphor screen a volatilizable substrate depositing a metal layer upon the substrate, and then volatilizing or backing out the substrate. U.S. Pat. No. 3,582,390 discloses a method of forming such a volatilizable substrate as mentioned above. In this case, a water based emulsion containing an acrylic resin is coated on the surface of the phosphor screen followed by drying. The "acrylic resin" mentioned includes acrylate resin copolymer and acrylate resin. It is necessary that the acrylic resin film formed be thick enough to fill the depressions of the rought surface of the phosphor screen so as to provide a substrate having a smooth surface upon which the metal layer is formed. But, the film should not be too thick. In the subsequent volatilizing step, voluminous gases are generated from the thick film owing to thermal decomposition of the acrylic resin film, causing blistering or cracks of the formed metal layer. Accordingly, in order to form a metal layer free from blistering and having a smooth surface it is necessary to control the thickness of the acrylic resin film appropriately. Such a control is difficult to achieve. Attentions should also be paid to the fact that the acrylic resin film is generally formed from an emulsion of acrylic resin particles. It follows that a large number of small depressions are observed on the surface of the acrylic resin film formed when the film is subjected to a microscopic observation. Obviously, the metal layer formed on the film can not help receiving influences from the irregular surface of the film.

SUMMARY OF THE INVENTION

It is accordingly an object of this invention to provide a volatilizable substrate capable of preventing blistering of the metal layer.

Another object is to provide a method of forming on the surface of the phosphor screen for a cathode ray tube a metal layer having a smooth surface.

Another object is to provide a method permitting an easy control of the thickness of the volatilizable substrate which is baked out in the subsequent heating step.

Another object is to provide a method permitting the phosphor dots not to be impregnated with a water-based emulsion of an acrylic resin.

Still another object of this invention is to provide a method permitting making more smooth the surface of the acrylic resin layer formed of a water-based emulsion of an acrylic resin.

The above objects and other advantages of this invention are achieved by forming a laminate of superposed layers respectively representing different organic substances on the surface of the phosphor screen for a cathode ray tube and, then, forming a metal layer on the laminate, followed by heating for volatilizing the laminate. The superposed layers constituting the laminate have different thermal decomposition points. The laminate may consist of an acrylic resin film or layer and a film of a water-soluble high molecular compound formed on the acrylic resin film. But, a more preferred laminate is of a three-layer type, which is prepared by forming an additional film of a silane compound beneath the acrylic resin film.

The laminate of this invention is advantageous over the conventional acrylic resin film of one layer type in that the laminate permits forming a metal layer having a more smooth surface. As mentioned previously, the organic materials constituting the laminate have different thermal decomposition points. Thus, when one of the films of the laminate has been decomposed and volatilized fine spaces are formed between the phosphor screen and the metal layer. The gases generated from the remaining films at higher temperatures readily escape through the fine spaces mentioned, rendering it easier to withdraw gases than in the conventional method in which gases tend to be generated very rapidly. Obviously, the laminate of this invention is effective in protecting the metal layer from blistering.

DESCRIPTION OF THE PREFERRED EMBODIMENTS

Figure 1:
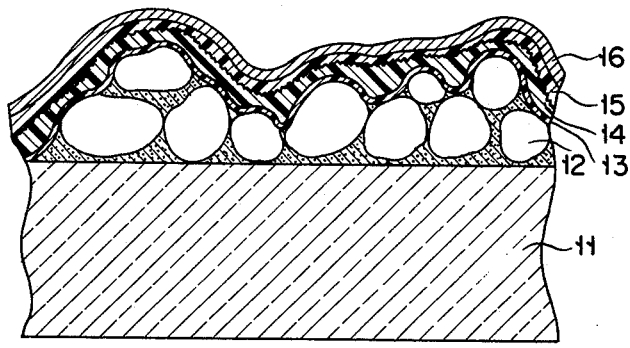
FIG. 1 is the fragmentary sectional view of an aluminzed color television screen according to one embodiment of the present invention.

According to FIG. 1 one preferred embodiment of this invention is explained as follows. Reference numeral 11 in FIG. 1 denotes a portion of the glass face plate of a color television picture tube, numeral 12 representing dots of phosphor formed over the face plate 11. A silane compound layer 13 is formed to cover the phosphor dots 12. The layer 13 is formed by coating the phosphor dots 12 with an aqueous solution consisting essentially of a silane compound, followed by drying. It is possible to remove excess solution and level the thickness of the solution film by rotating the face plate 11 during the coating step. The silane compound used includes glycidoxypropyl trimethoxy silane (available from Toray Silicone Inc. under the trade name of "SH-6040"), γ-glycidoxypropyl trimethoxy silane (available from Union Carbide Corp. under the trade name of "A-187"), γ-amino propyl triethoxy silane (trade name "A-1100", Union Carbide Corp.) and γ-methacryloxypropyl trimethyloxy silane (trade name "A-174", Union Carbide Corp.). It is preferred that the aqueous solution contain about 0.1 to 10 percent by weight of the silane compound.

An acrylic resin layer 14 above the silane compound layer 13 is formed by coating the film 13 with an aqueous emulsion consisting essentially of an acrylic resin, followed by drying. The acrylic resin used is substantially the same as that used in U.S. Pat. No. 3,582,390 mentioned earlier and includes acrylate resin and acrylate resin copolymer. A preferred acrylic resin content of the emulsion ranges from about 10 to 30 percent by weight. As is the case with the formation of the silane compound layer, it is preferred to rotate the face plate 11 during the coating step of the acrylic resin emulsion.

Formed on the acrylic resin layer 14 is a layer 15 of a water-soluble high molecular compound. The layer 15 is formed by coating the acrylic resin layer 14 with an aqueous solution consisting essentially of a water-soluble polymer, followed by drying. The water-soluble polymer used includes polyvinyl alcohol, polyvinyl pyrrolidone and polyacrylamide. The aqueous solution of the polymer may contain traces of colloidal silica. It is preferred that the aqueous solution contain about 0.05 to 20 percent by weight of the water-soluble polymer. It is also preferred to rotate the face plate 11 during the coating step of the water-soluble polymer.

An aluminum film 16 is formed on the water-soluble polymer layer 15 by vacuum deposition.

Figure 2:
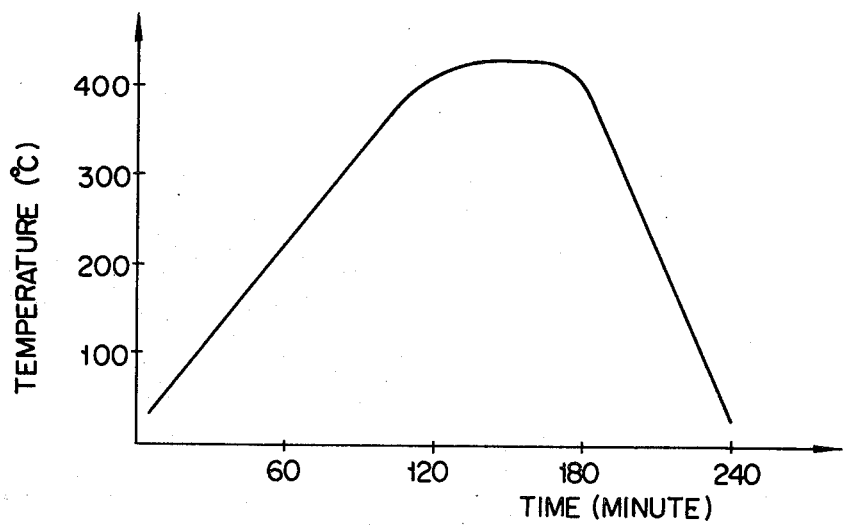
FIG. 2 is a graph of temperature relative to time for volatilizing the substrate of the present invention, the abscissa plotting the time after the start of heating.

The metallized laminate is then subjected to continuous heating to 430° C in such a manner as shown in FIG. 2. Since the silane compound layer 13, the acrylic resin layer 14 and the water-soluble polymer layer 15 are sequentially decomposed and volatilized with time in accordance with their thermal decomposition points, a large amount of gas is not evolved at a time. As described earlier, the gases evolved from the layer having a lower thermal decomposition point form passageways through which the gases evolved from the other films escape, thereby preventing blistering of the aluminum film.

FIG. 1 suggests a merit of this invention. Namely, the loss of the acrylic resin can be decreased because the silane compound layer 13 prevents the acrylic resin emulsion from entering the spaces between the phosphor dots. Where, for example, glycidoxypropyl trimethoxy silane is used as the silane compound, the methoxy group tends to be adsorbed by inorganic substance and the glycidoxypropyl group by organic substance. It follows that the methoxy groups of the silane compound are adsorbed by the phosphor (inorganic compound) and the glycidoxypropyl group by the acrylic resin (organic compound) which is coated on the silane compound. As the result, the particles of the acrylic resin are prevented from entering the spaces between the phosphor dots.

The water-soluble polymer layer 15 serves to make more smooth the surface of the acrylic resin layer 14, resulting in that the aluminum film 16 formed on the layer 15 is enabled to reflect the luminescent light more effectively than an aluminum film formed directly on the acrylic resin film.

The laminate made of a plurality of organic films produces an additional effect. Whether the acrylic resin layer is slightly thinner or thicker than desired, the blistering of the metal layer is not caused, leading to a prominently high productivity or yield of the product cathode ray tube.

This invention comprises the case of excluding the silane compound film 13 from the laminate shown in FIG. 1. The resultant-two-film system exhibits the effects substantially equal to the laminate of the three-film system described. It is naturally obvious to those skilled in the art to provide laminates of multi-layers exceeding three layers on the basis of the technical idea of this invention.

Described in the following are examples of this invention.

EXAMPLE 1

The following Table shows the brightness of 18 inch color television picture tubes respectively provided with aluminized tricolor mosaic screens prepared according to the method of this invention and a prior art method.

Table

| Color | This invention | | Prior art | |
| --- | --- | --- | --- | --- |
| Green | 133.6 | (fL) | 119.3 | (fL) |
| Blue | 21.0 | (fL) | 18.5 | (fL) |
| Red | 32.0 | (fL) | 29.1 | (fL) |
| White | 213 | (μA) | 237 | (μA) |

In the case of this invention, a silane compound film, an acrylic resin film and a water soluble polymer film were successively formed over the phosphor dots supported by the glass face plate in the manner described. Specifically, the substances mentioned were coated while the glass face plate was rotated and then dried. For the formation of the silane compound film, used was an aqueous solution containing 5% by weight of "A-187", γ-glycidoxypropyl trimethoxy silane. Used was an aqueous emulsion containing 14% by weight of acrylic resin for the formation of the acrylic resin film. On the other hand, 6 wt % aqueous solution of polyvinyl alcohol was used for the formation of the water-soluble polymer film. Finally, the organic laminate thus formed was aluminized by vacuum deposition and then baked so as to volatilize the films of the three organic substances.

In the case of the prior art, an aqueous solution containing 14% by weight of acrylic resin was coated over the phosphor dots, followed by drying so as to form an acrylic resin film. Then, an aluminum layer was formed on the acrylic resin film by vacuum deposition, followed by baking out the resin film.

The brightness in food Lamberts (fL) for each of green, blue and red colors on the color television picture tube was determined under a fixed current and voltage. On the other had, the brightness of the white screen was determined in terms of the total current (μA) flowing through the three electron guns required for keeping the brightness of the white screen, a specified tint of white, at 32 foot Lamberts.

The above Table shows that the case of this invention is brighter than the prior art case by about 10%.

EXAMPLE 2

An organic laminate of two-film type was prepared in substantially the same manner as in Example 1. In this case the acrylic resin film was formed on the phosphor dots using an aqueous emulsion containing 14% by weight of acrylic resin. Then, the water-soluble polymer film was formed on the acrylic resin film using an aqueous solution containing 0.5% by weight of polyvinyl alcohol and 0.2% by weight of colloidal silica.

In the heating step, the water-soluble polymer film was decomposed at about 270° C and the acrylic resin film at about 300° C. The brightness of the color television picture tube equipped with the metallized phosphor screen thus prepared was nearly equal to or just slightly lower than that for the laminate of three-film type shown in Example 1.

EXAMPLE 3

A metallized phosphor screen was prepared in substantially the same manner as in Example 2 except that the water-soluble polymer layer was formed using an aqueous solution containing 5% by weight of plyvinyl pyrrolidone having a thermal decomposition point of 260° C. The brightness in this case was substantially equal to that for Example 2.

EXAMPLE 4

The same procedures as in Example 3 were followed except that polyacrylamide having a thermal decomposition point of 200° C was substituted for polyvinyl pyrrolidone, with the result that the brightness concerned was substantially equal to that for Example 2.

What we claim is:

1. A method of metallizing a phosphor screen for a cathode ray tube including the steps of forming a volatilizable substrate on the surface of the phosphor screen and depositing a metal layer upon the substrate, followed by heating for volatilizing the substrate, characterized in that the substrate consists of a layer of acrylic resin and a layer of polyvinyl pyrrolidone.

2. A method of metallizing a phosphor screen for a cathode ray tube including the steps of forming a volatizable substrate on the surface of the phosphor screen and depositing a metal layer upon the substrate, followed by heating for volatilizing the substrate, characterized in that the substrate consists of a layer of a silane compound, a layer of acrylic resin formed on the silane compound layer and a layer of a water-soluble polymer formed on the acrylic resin layer, the silane compound being selected from the group consisting of glycidoxypropyltrimethoxy silane, γ-aminopropyl triethyoxy silane andd γ-methacryloxy propyl trimethoxy silane.

3. The method according to claim 2, in which the water-soluble polymer is selected from the group consisting of polyvinyl alcohol, polyvinyl pyrrolidone, and polyacrylamide.

4. The method according to claim 2, in which said glycidoxypropyltrimethoxy silane is γ-glycidoxypropyl trimethoxy silane.

5. The method according to claim 2, in which the silane compound layer is formed by coating the surface of the phosphor screen with an aqueous solution consisting essentially of the silane compound, followed by drying, the acrylic resin layer is formed by coating the silane compound layer with an aqueous emulsion consisting essentially of an acrylic resin, followed by drying, and the water-soluble polymer layer is formed by coating the acrylic resin layer with an aqueous solution consisting essentially of a water-soluble polymer, followed by drying.

6. The method according to claim 2, in which the silane compound content of the aqueous solution is 0.1 to 10 percent by weight, the acrylic resin content of the aqueous emulsion is 10 to 30 percent by weight, and the water-soluble polymer content of the aqueous solution is 0.05 to 20 percent by weight.

* * * * *